(12) United States Patent
Yan et al.

(10) Patent No.: US 11,018,165 B2
(45) Date of Patent: May 25, 2021

(54) MANUFACTURING METHOD OF ARRAY SUBSTRATE AND ARRAY SUBSTRATE

(71) Applicant: WUHAN CHINA STAR OPTOELECTRONICS TECHNOLOGY CO., LTD., Wuhan (CN)

(72) Inventors: Yuan Yan, Wuhan (CN); Fei Ai, Wuhan (CN); Peng He, Wuhan (CN); Peng Lu, Wuhan (CN)

( * ) Notice: Subject to any disclaimer, the term of this patent is extended or adjusted under 35 U.S.C. 154(b) by 0 days.

(21) Appl. No.: 16/641,663

(22) PCT Filed: Nov. 6, 2019

(86) PCT No.: PCT/CN2019/116102
§ 371 (c)(1),
(2) Date: Feb. 25, 2020

(87) PCT Pub. No.: WO2021/031374
PCT Pub. Date: Feb. 25, 2021

(65) Prior Publication Data
US 2021/0074742 A1    Mar. 11, 2021

(30) Foreign Application Priority Data
Aug. 20, 2019  (CN) .......................... 201910768388.2

(51) Int. Cl.
*G06F 3/041*    (2006.01)
*H01L 27/12*    (2006.01)

(52) U.S. Cl.
CPC ........ *H01L 27/1288* (2013.01); *G06F 3/0412* (2013.01); *H01L 27/124* (2013.01); *G06F 2203/04103* (2013.01)

(58) Field of Classification Search
CPC ................... G06F 3/041; G06F 3/0412; G06F 2203/04103; H01L 27/124; H01L 27/1288
See application file for complete search history.

(56) References Cited

U.S. PATENT DOCUMENTS

| | | | | |
|---|---|---|---|---|
| 8,598,589 | B2 * | 12/2013 | Ma ...................... | H01L 27/1288 257/71 |
| 9,638,949 | B1 * | 5/2017 | Kim .................. | G02F 1/136286 |
| 10,644,041 | B1 * | 5/2020 | Zhang .................. | H01L 27/127 |
| 2011/0122355 | A1 * | 5/2011 | Matsumura ......... | H01L 27/1225 349/143 |
| 2011/0227850 | A1 * | 9/2011 | Oh ........................ | G06F 3/0446 345/173 |
| 2015/0378223 | A1 * | 12/2015 | Wen .................. | H01L 21/76804 349/40 |
| 2016/0266706 | A1 * | 9/2016 | Lu ....................... | G06F 3/04164 |
| 2016/0343737 | A1 * | 11/2016 | Zhang ............... | H01L 29/78678 |

(Continued)

*Primary Examiner* — Joe H Cheng

(57) ABSTRACT

A manufacturing method of an array substrate and the array substrate are provided. The method comprises: forming an active layer on a substrate; forming an insulation layer on the active layer; forming a first metal layer on the insulation layer; forming an interlayer dielectric layer and a pixel electrode layer on the first metal layer by a same mask; forming a second metal layer on the interlayer dielectric layer, wherein the second metal layer comprises a source electrode, a drain electrode, and a touch signal line; and forming a patterned protective layer and a patterned common electrode layer on the second metal layer.

15 Claims, 5 Drawing Sheets

(56) References Cited

U.S. PATENT DOCUMENTS

2017/0160841 A1* 6/2017 Lou .................... G06F 3/04164
2017/0185194 A1* 6/2017 Kim .................... G06F 3/0412
2018/0095318 A1* 4/2018 Pyo .................... H01L 27/1214

* cited by examiner

| Providing a substrate. | — S1 |

| Forming a patterned active layer on the substrate. | — S2 |

| Forming an insulation layer on the active layer. | — S3 |

| Forming a patterned first metal layer on the insulation layer. | — S4 |

| Forming a patterned interlayer dielectric layer and a patterned pixel electrode layer on the first metal layer by a same mask, wherein the patterned pixel electrode layer comprises a pixel electrode. | — S5 |

| Forming a patterned second metal layer on the interlayer dielectric layer, wherein the patterned second metal layer comprises a drain electrode and a touch signal line, and the drain electrode is electrically connected to the pixel electrode. | — S6 |

| Forming a patterned protective layer and a patterned common electrode layer on the second metal layer by a same mask, wherein the patterned common electrode layer comprises a touch electrode, and the touch electrode is electrically connected to the touch signal line. | — S7 |

FIG. 1

MANUFACTURING METHOD OF ARRAY SUBSTRATE AND ARRAY SUBSTRATE

CROSS REFERENCE TO RELATED APPLICATIONS

This application is a national stage of PCT/CN2019/116102, filed on Nov. 6, 2019 and claims priority to Chinese Application No. 201910768388.2, filed on Aug. 20, 2019.

FIELD OF INVENTION

The present disclosure relates to the field of display technologies, and more particularly, to a manufacturing method of an array substrate and the array substrate.

BACKGROUND OF INVENTION

With development of integrated touch display panels, demands for high resolution are becoming increasingly higher. Therefore, a fine active drive matrix (array substrate) is required to cooperate with liquid crystals in each pixel area for deflection.

However, current manufacturing methods of integrated touch array substrates are cumbersome and causes a higher production cost and a longer cycle.

SUMMARY OF INVENTION

The present disclosure provides a manufacturing method of an array substrate and an array substrate to solve the technical problem of that current manufacturing methods of integrated touch array substrates are cumbersome and causes a higher production cost and a longer cycle.

An embodiment of the present disclosure provides a manufacturing method of an array substrate, which comprises following steps:

providing a substrate;
forming a patterned active layer on the substrate;
forming an insulation layer on the active layer;
forming a patterned first metal layer on the insulation layer;
forming a patterned interlayer dielectric layer and a patterned pixel electrode layer on the first metal layer by a same mask, wherein the patterned pixel electrode layer comprises a pixel electrode;
forming a patterned second metal layer on the interlayer dielectric layer, wherein the patterned second metal layer comprises a drain electrode and a touch signal line, and the drain electrode is electrically connected to the pixel electrode;
forming a patterned protective layer and a patterned common electrode layer on the second metal layer by a same mask, wherein the patterned common electrode layer comprises a touch electrode, and the touch electrode is electrically connected to the touch signal line;
wherein forming the patterned interlayer dielectric layer and the patterned pixel electrode layer on the first metal layer by a same mask comprises following steps:
forming an interlayer dielectric layer, a pixel electrode layer, and a first photoresist layer on the first metal layer in sequence;
using a first half-tone mask to expose the first photoresist layer and then developing the first photoresist layer to make a part of the first photoresist layer corresponding to a source/drain electrode area of the active layer form a first through-hole and make a part of the first photoresist layer corresponding to a part of a touch signal line to be formed in the second metal layer form a first recessed part, wherein the first through-hole of the first photoresist layer corresponding to the source electrode area of the active layer is connected to the first recessed part;
etching the pixel electrode layer and the interlayer dielectric layer to expose the source/drain electrode area of the active layer to the first through-hole;
ashing the first photoresist layer to remove a part of the first photoresist layer corresponding to the first recessed part;
etching the pixel electrode layer to remove a part of the pixel electrode layer corresponding to the first recessed part; and
removing the first photoresist layer.

In the manufacturing method of the array substrate of the present disclosure, the first half-tone mask comprises a first light-transmission part and a second light-transmission part, a transmittance of the first light-transmission part is greater than a transmittance of the second light-transmission part, the transmittance of the first light-transmission part is 100%, the first light-transmission part corresponds to the source/drain electrode area of the active layer, and the second light-transmission part corresponds to the part of the touch signal line to be formed in the second metal layer.

In the manufacturing method of the array substrate of the present disclosure, wherein forming the patterned protective layer and the patterned common electrode layer on the second metal layer by a same mask comprises following steps:

forming a protective layer and a second photoresist layer on the second metal layer in sequence;
using a second half-tone mask to expose the second photoresist layer and then developing the second photoresist layer to make a part of the second photoresist layer corresponding to the touch signal line form a second through-hole and make a part of the second photoresist layer corresponding to a part of a common electrode and a touch electrode to be formed in the common electrode layer form a second recessed part, wherein the second through-hole of the second photoresist layer corresponding to the touch signal line is connected to the second recessed part;
etching the protective layer to expose the touch signal line to the second through-hole;
ashing the second photoresist layer to remove a part of the second photoresist layer corresponding to the second recessed part, and defining the remaining second photoresist layer to form a plurality of third recessed parts exposing the protective layer;
ashing the second photoresist layer and the protective layer to extend the third recessed parts to the protective layer;
forming a common electrode layer on the second photoresist layer, wherein a part of the common electrode layer is formed on the second photoresist layer and another part of the common electrode layer is formed on the protective layer; and
removing the second photoresist layer.

In the manufacturing method of the array substrate of the present disclosure, the second half-tone mask comprises a third light-transmission part and a fourth light-transmission part, a transmittance of the third light-transmission part is greater than a transmittance of the fourth light-transmission part, the transmittance of the third light-transmission part is 100%, the third light-transmission part corresponds to the touch signal line, and the fourth light-transmission part corresponds to the part of the common electrode and the touch electrode to be formed in the common electrode layer.

In the manufacturing method of the array substrate of the present disclosure, the patterned first metal layer is formed by a self-aligned doping process.

An embodiment of the present disclosure further provides a manufacturing method of an array substrate, which comprises following steps:

providing a substrate;

forming a patterned active layer on the substrate;

forming an insulation layer on the active layer;

forming a patterned first metal layer on the insulation layer;

forming a patterned interlayer dielectric layer and a patterned pixel electrode layer on the first metal layer by a same mask, wherein the patterned pixel electrode layer comprises a pixel electrode;

forming a patterned second metal layer on the interlayer dielectric layer, wherein the patterned second metal layer comprises a drain electrode and a touch signal line, and the drain electrode is electrically connected to the pixel electrode;

forming a patterned protective layer and a patterned common electrode layer on the second metal layer, wherein the patterned common electrode layer comprises a touch electrode, and the touch electrode is electrically connected to the touch signal line.

In the manufacturing method of the array substrate of the present disclosure, forming the patterned interlayer dielectric layer and the patterned pixel electrode layer on the first metal layer by a same mask comprises following steps:

forming an interlayer dielectric layer, a pixel electrode layer, and a first photoresist layer on the first metal layer in sequence;

using a first half-tone mask to expose the first photoresist layer and then developing the first photoresist layer to make a part of the first photoresist layer corresponding to a source/drain electrode area of the active layer form a first through-hole and make a part of the first photoresist layer corresponding to a part of a touch signal line to be formed in the second metal layer form a first recessed part, wherein the first through-hole of the first photoresist layer corresponding to the source electrode area of the active layer is connected to the first recessed part;

etching the pixel electrode layer and the interlayer dielectric layer to expose the source/drain electrode area of the active layer to the first through-hole;

ashing the first photoresist layer to remove a part of the first photoresist layer corresponding to the first recessed part;

etching the pixel electrode layer to remove a part of the pixel electrode layer corresponding to the first recessed part; and removing the first photoresist layer.

In the manufacturing method of the array substrate of the present disclosure, the first half-tone mask comprises a first light-transmission part and a second light-transmission part, a transmittance of the first light-transmission part is greater than a transmittance of the second light-transmission part, the transmittance of the first light-transmission part is 100%, the first light-transmission part corresponds to the source/drain electrode area of the active layer, and the second light-transmission part corresponds to the part of the touch signal line to be formed in the second metal layer.

In the manufacturing method of the array substrate of the present disclosure, the patterned protective layer and the patterned common electrode layer are formed on the second metal layer by a same mask.

In the manufacturing method of the array substrate of the present disclosure, wherein forming the patterned protective layer and the patterned common electrode layer on the second metal layer by a same mask comprises following steps:

forming a protective layer and a second photoresist layer on the second metal layer in sequence;

using a second half-tone mask to expose the second photoresist layer and then developing the second photoresist layer to make a part of the second photoresist layer corresponding to the touch signal line form a second through-hole and make a part of the second photoresist layer corresponding to a part of a common electrode and a touch electrode to be formed in the common electrode layer form a second recessed part, wherein the second through-hole of the second photoresist layer corresponding to the touch signal line is connected to the second recessed part;

etching the protective layer to expose the touch signal line to the second through-hole;

ashing the second photoresist layer to remove a part of the second photoresist layer corresponding to the second recessed part, and defining the remaining second photoresist layer to form a plurality of third recessed parts exposing the protective layer;

ashing the second photoresist layer and the protective layer to extend the third recessed parts to the protective layer;

forming a common electrode layer on the second photoresist layer, wherein a part of the common electrode layer is formed on the second photoresist layer and another part of the common electrode layer is formed on the protective layer; and removing the second photoresist layer.

In the manufacturing method of the array substrate of the present disclosure, the second half-tone mask comprises a third light-transmission part and a fourth light-transmission part, a transmittance of the third light-transmission part is greater than a transmittance of the fourth light-transmission part, the transmittance of the third light-transmission part is 100%, the third light-transmission part corresponds to the touch signal line, and the fourth light-transmission part corresponds to the part of the common electrode and the touch electrode to be formed in the common electrode layer.

In the manufacturing method of the array substrate of the present disclosure, the patterned first metal layer is formed by a self-aligned doping process.

In the manufacturing method of the array substrate of the present disclosure, the common electrode layer and the pixel electrode layer are transparent conductive layers.

In the manufacturing method of the array substrate of the present disclosure, a material of the transparent conductive layers is indium tin oxide.

The present disclosure also relates to an array substrate which comprises a substrate and an active layer, an insulation layer, a first metal layer, an interlayer dielectric layer, a pixel electrode layer, a second metal layer, a protective layer, and a common electrode layer disposed on the substrate in sequence.

Wherein the second metal layer comprises a drain electrode and a touch signal line, the pixel electrode layer comprises a pixel electrode, the common electrode layer comprises a touch electrode, the drain electrode is electrically connected to the pixel electrode, and the touch signal line is electrically connected to the touch electrode.

In the array substrate of the present disclosure, the touch signal line and the pixel electrode layer are disposed on a same layer.

In the array substrate of the present disclosure, the drain electrode is stacked on the pixel electrode layer.

Compared to current manufacturing methods of array substrates, the manufacturing method of the array substrate and the array substrate of the present disclosure use a same mask to form a patterned interlayer dielectric layer and a patterned pixel electrode layer that not only saves a mask, but also omits an organic planarization layer. It solves the technical problem that current manufacturing methods of integrated touch array substrates are cumbersome and causes a higher production cost and a longer cycle.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

FIG. 1 is a schematic process diagram of a manufacturing method of an array substrate according to an embodiment of the present disclosure.

DETAILED DESCRIPTION OF PREFERRED EMBODIMENTS

Figure 2:
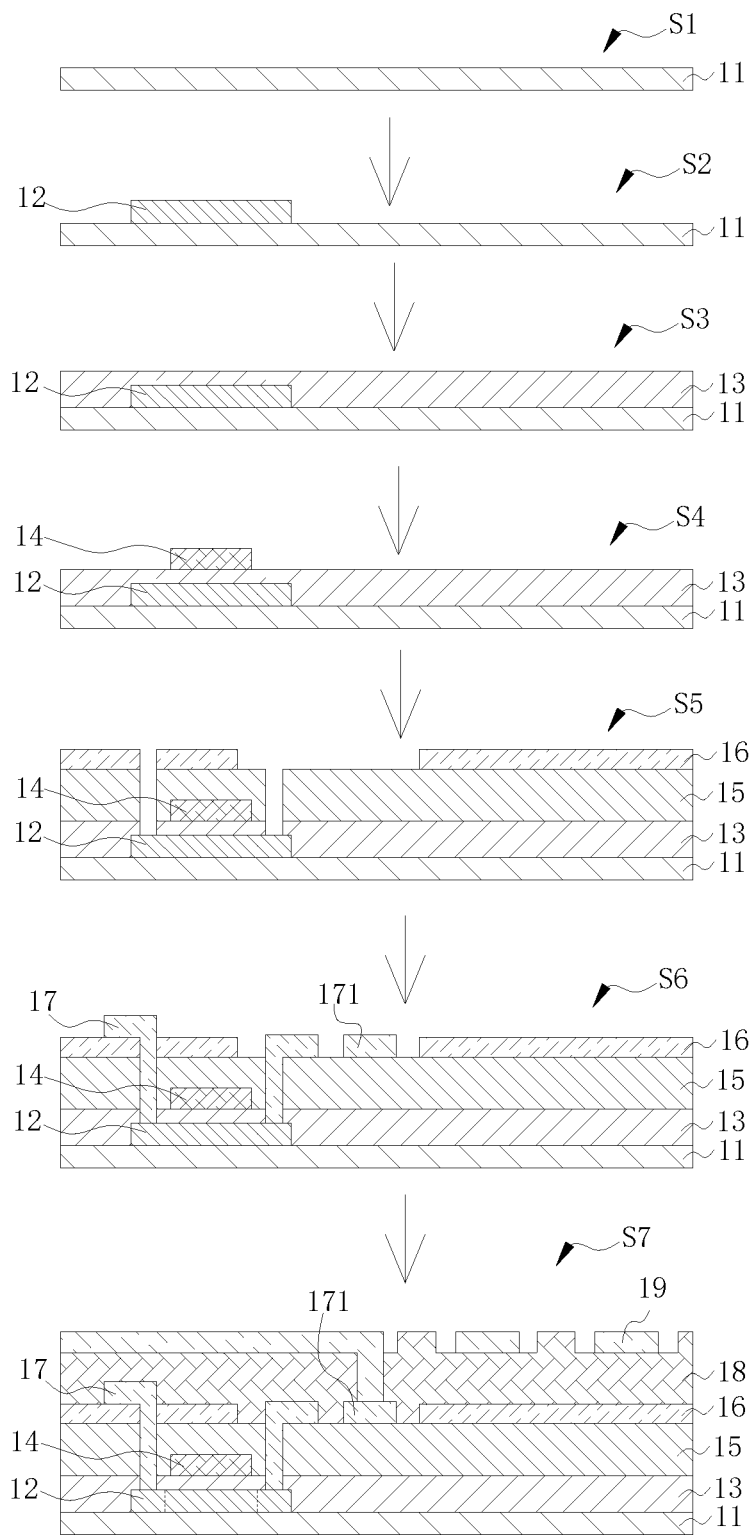
FIG. 2 is another schematic process diagram of a manufacturing method of an array substrate according to an embodiment of the present disclosure.

Please refer to the drawings, in which the same reference numerals represent the same components. The following description is based on the specific embodiments of the present disclosure as illustrated, and should not be considered as limiting other specific embodiments not specifically described herein.

FIG. 1 is a schematic process diagram of a manufacturing method of an array substrate according to an embodiment of the present disclosure. FIG. 2 is another schematic process diagram of a manufacturing method of an array substrate according to an embodiment of the present disclosure.

A manufacturing method of an array substrate, comprising following steps:

step S1: providing a substrate 11;

step S2: forming a patterned active layer 12 on the substrate 11;

step S3: forming an insulation layer 13 on the active layer 12;

step S4: forming a patterned first metal layer 14 on the insulation layer 13, wherein the patterned first metal layer 14 includes a gate electrode;

step S5: forming a patterned interlayer dielectric layer 15 and a patterned pixel electrode layer 16 on the first metal layer 14 by a same mask;

step S6: forming a patterned second metal layer 17 on the interlayer dielectric layer 15, wherein the patterned second metal layer 17 comprises a source electrode, a drain electrode, and a touch signal line 171; and step S7: forming a patterned protective layer 18 and a patterned common electrode layer 19 on the second metal layer 17.

The manufacturing method of the array substrate in the embodiment of the present disclosure saves a mask process and omits an organic planarization layer by using a same mask forming the patterned interlayer dielectric layer 15 and the patterned pixel electrode layer 16, thereby improving manufacturing efficiency of the embodiment and saving cost. The manufacturing method of the array substrate in the embodiment of the present disclosure is described in detail below.

In the step S1, providing the substrate 11. The substrate 11 is a rigid substrate. Optionally, it can be a glass substrate, but it is not limited thereto. Then proceed to step S2.

In the step S2, forming the patterned active layer 12 on the substrate 11. Forming an amorphous silicon layer on the substrate 11 first, then laser annealing the amorphous silicon layer to form a polysilicon layer, and at last, using a mask patterning the polysilicon layer to form a patterned low temperature polysilicon layer, that is, forming the patterned active layer 12.

In the embodiment, a light-shielding layer to shield the active layer 12 is omitted. Since the light-shielding layer is omitted, an ion doping ratio in the source/drain electrode area of the active layer 12 needs to be adjusted to compensate for the weak electricity of the active layer generated after being illuminated. Then proceed to step S3.

In the step S3, forming the insulation layer 13 on the active layer 12. Then proceed to step S4.

In the step S4, forming the patterned first metal layer 14 on the insulation layer 13. Wherein, the patterned first metal layer 14 is formed by a self-aligned doping process. Only one mask is used to achieve patterning of a gate electrode, an ohmic contact area, and a lightly doped area by the self-aligned doping process, which reduces the number of masks.

The patterned first metal layer 14 comprises the gate electrode. The gate electrode is a gate electrode of a thin film transistor of the array substrate in the embodiment. Then proceed to step S5.

In the step S5, forming the patterned interlayer dielectric layer 15 and the patterned pixel electrode layer 16 on the first metal layer 14 by a same mask.

Figure 3:
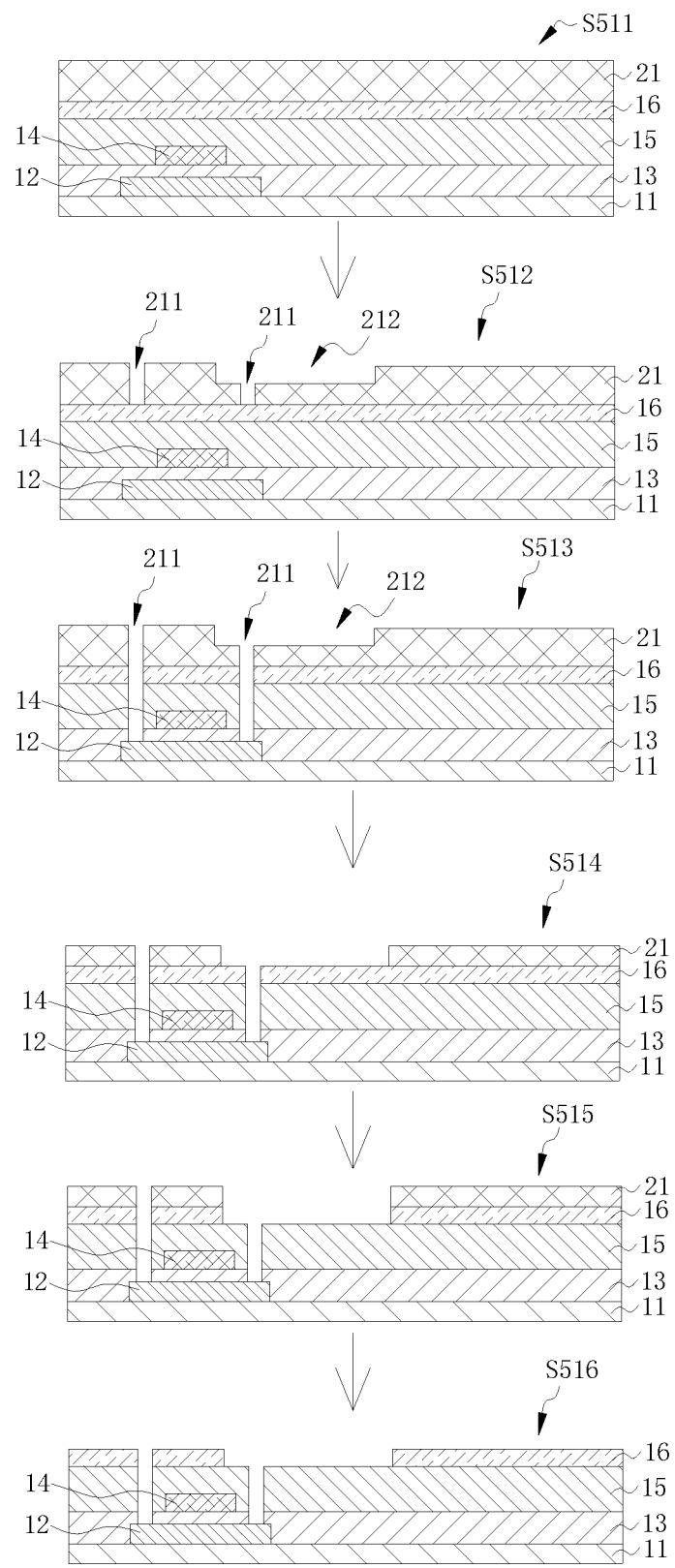
FIG. 3 is a schematic process diagram of step S5 in the manufacturing method of the array substrate according to an embodiment of the present disclosure.

Specifically, referring to FIG. 3, FIG. 3 is a schematic process diagram of step S5 in the manufacturing method of the array substrate according to an embodiment of the present disclosure.

Step S5: forming the patterned interlayer dielectric layer 15 and the patterned pixel electrode layer 16 on the first metal layer 14 by the same mask comprises following steps:

step S511: forming the interlayer dielectric layer 15, the pixel electrode layer 16, and a first photoresist layer 21 on the first metal layer 14 in sequence;

step S512: using a first half-tone mask to expose the first photoresist layer 21 and then developing the first photoresist layer 21 to make a part of the first photoresist layer 21 corresponding to a source/drain electrode area of the active layer 12 form a first through-hole 211, and make a part of the first photoresist layer 21 corresponding to a part of a touch signal line 171 to be formed in the second metal layer form a first recessed part 212, wherein the first through-hole 211 of the first photoresist layer 21 corresponding to the source electrode area of the active layer 12 is connected to the first recessed part 212;

step S513: etching the pixel electrode layer 16 and the interlayer dielectric layer 15 to make the source/drain electrode area of the active layer 12 exposed to the first through-hole 211;

step S514: ashing the first photoresist layer 21 to remove a part of the first photoresist layer 21 corresponding to the first recessed part 212;

step S515: etching the pixel electrode layer 16 to remove a part of the pixel electrode layer 16 corresponding to the first recessed part 212; and step S516: removing the first photoresist layer 21.

In the step S511, compared to current technology, forming the interlayer dielectric layer 15 and the pixel electrode layer 16 on the first metal layer 14 in sequence omits an organic planarization layer, simplifies process steps, and reduces manufacturing cost. In current technology, an organic planarization layer is disposed between an interlayer dielectric layer and a pixel electrode layer. The pixel electrode layer 16 is a transparent conductive layer. Optionally, a material of the transparent conductive layer is indium tin oxide.

In the step S512, the first half-tone mask comprises a first light-transmission part and a second light-transmission part, a transmittance of the first light-transmission part is greater than a transmittance of the second light-transmission part, the transmittance of the first light-transmission part is 100%, the first light-transmission part corresponds to the source/drain electrode area of the active layer, and the second light-transmission part corresponds to the part of the touch signal line 171 to be formed in the second metal layer. Wherein, after the first photoresist layer 21 in the touch signal line 171 area is removed, the touch signal line 171 is formed on the interlayer dielectric layer 15 corresponding to the area.

In the step S513, besides etching the pixel electrode layer 16 and the interlayer dielectric layer 15, the insulation layer 13 also needs to be etched to expose the source/drain electrode area of the active layer 12. Then, proceed to step S514 to step S516. In the step S515, etching the exposed pixel electrode layer 16 to pattern the pixel electrode layer 16. The patterned pixel electrode layer 16 comprises a pixel electrode.

The step S5 uses a same mask forming the patterned interlayer dielectric layer 15 and the patterned pixel electrode layer 16, which saves a mask process and simplifies the steps of the manufacturing method of the array substrate in the embodiment. Then, proceed to step S6.

In the step S6, forming a patterned second metal layer 17 on the interlayer dielectric layer 15, wherein the patterned second metal layer 17 comprises a source electrode, a drain electrode, and a touch signal line 171. Specifically, the second metal layer 17 is formed by photolithography. Wherein, the source electrode and the drain electrode are as a source electrode and a drain electrode of a thin film transistor in the embodiment. The drain electrode of the thin film transistor is electrically connected to the pixel electrode. Then, proceed to step S7.

In the step S7, forming a patterned protective layer 18 and a patterned common electrode layer 19 on the second metal layer 17.

A same mask is used to form the patterned protective layer 18 and the patterned common electrode layer 19 on the second metal layer 17.

Figure 4:
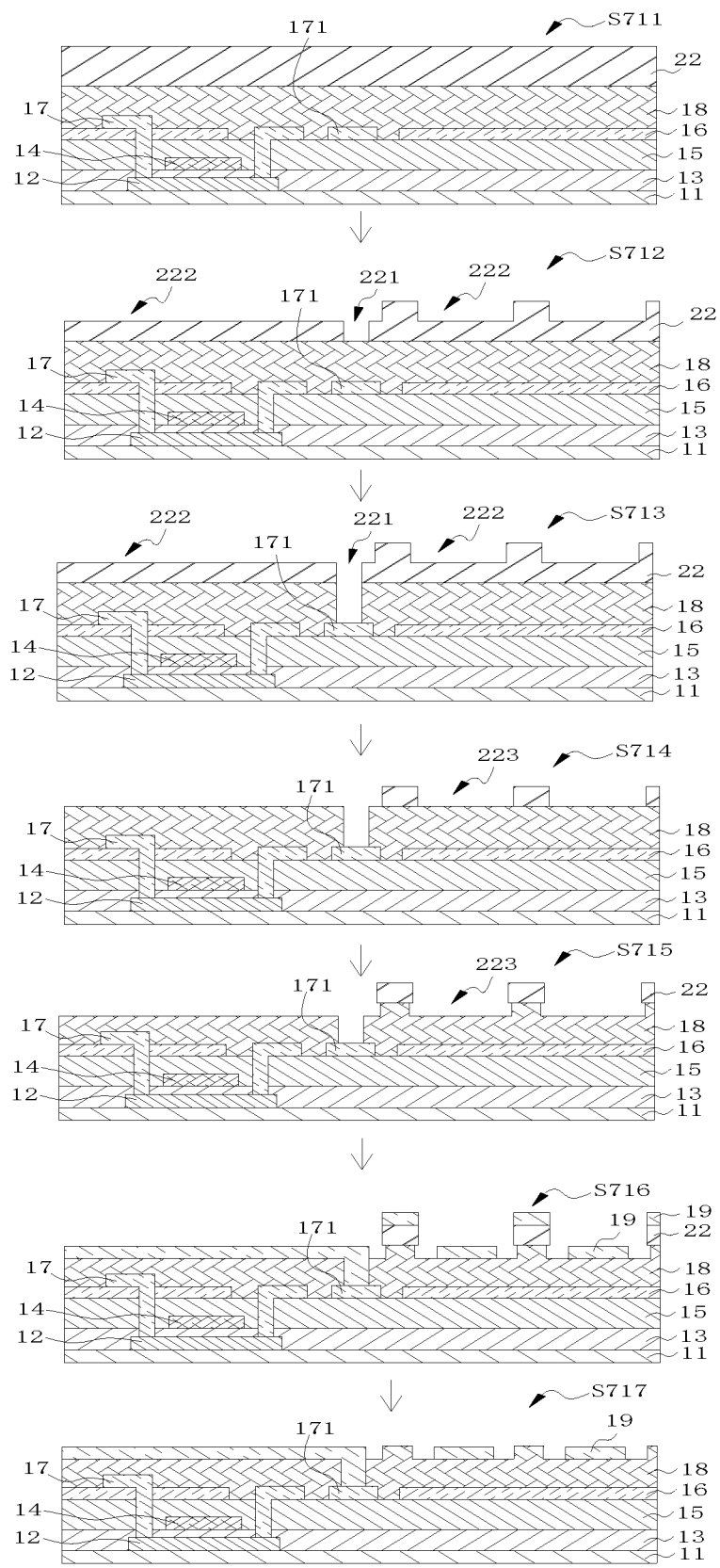
FIG. 4 is a schematic process diagram of step S7 in the manufacturing method of the array substrate according to an embodiment of the present disclosure.

Referring to FIG. 4, FIG. 4 is a schematic process diagram of step S7 in the manufacturing method of the array substrate according to an embodiment of the present disclosure.

Specifically, wherein forming the patterned protective layer 18 and the patterned common electrode layer 19 on the second metal layer 17 by a same mask comprises following steps:

step S711: forming a protective layer 18 and a second photoresist layer 22 on the second metal layer 17 in sequence;

step S712: using a second half-tone mask to expose the second photoresist layer 22 and then developing the second photoresist layer 22 to make a part of the second photoresist layer 22 corresponding to the touch signal line form a second through-hole 221, and make a part of the second photoresist layer 22 corresponding to a part of a common electrode and a touch electrode to be formed form a second recessed part 222, wherein the second through-hole 221 of the second photoresist layer 22 corresponding to the touch signal line is connected to the second recessed part 222;

step S713: etching the protective layer to expose the touch signal line to the second through-hole 221;

step S714: ashing the second photoresist layer 22 to remove a part of the second photoresist layer 22 corresponding to the second recessed part 222, and defining the remaining second photoresist layer 22 to form a plurality of third recessed parts 223 exposing the protective layer 18;

step S715: ashing the second photoresist layer 22 and the protective layer 18 to make the third recessed parts 223 extend to the protective layer 18;

step S716: forming the common electrode layer 19 on the second photoresist layer 22, wherein a part of the common electrode layer 19 is formed on the second photoresist layer 22 and another part of the common electrode layer 19 is formed on the protective layer 18; and step S717: removing the second photoresist layer 22.

Wherein, the second half-tone mask comprises a third light-transmission part and a fourth light-transmission part, a transmittance of the third light-transmission part is greater than a transmittance of the fourth light-transmission part, the transmittance of the third light-transmission part is 100%, the third light-transmission part corresponds to the touch signal line, and the fourth light-transmission part corresponds to the part of the common electrode and the touch electrode to be formed in the common electrode layer 19.

In the step S715, materials of the second photoresist layer 22 and the protective layer 18 are different. When using a specific ionic gas to etch the second photoresist layer 22 and the protective layer 18 during the ashing process, an ashing rate for the ionic gas to etch the second photoresist layer 22 is less than an ashing rate for the ionic gas to etch the protective layer 18. This setting makes the third recessed parts 223 extend to the protective layer 18 and deepens a depth of the third recessed parts 223. Since the depth of the third recessed parts 223 is deepened, the common electrode layer 19 formed on the second photoresist layer 22 and the common electrode layer 19 formed on the protective layer 18 are disconnected from each other, thereby the patterned common electrode layer 19 can be formed by merely removing the second photoresist layer 22.

In addition, a part of the third recessed parts 223 on the protective layer 18 extends to a direction of the second photoresist layer 22 and exposes a bottom surface of the second photoresist layer 22. That is, the second photoresist layer 22 and a protruding part of the protective layer 18 are stacked to form a bulge part having a chamfer, and the chamfer is disposed on the protruding part of the protective layer 18. The arrangement of the chamfer makes the common electrode layer 19 on the second photoresist layer 22 and the common electrode layer 19 on the protective layer 18 easier to disconnect; on the other hand, a stripping liquid of the second photoresist layer 22 is more fully contacted with the second photoresist layer 22, thereby improving stability and efficiency of stripping the second photoresist layer 22.

Wherein, the patterned common electrode layer 19 comprises the touch electrode and the common electrode, and the touch electrode and the common electrode share a same patterned common electrode layer. That is, a touch electrode is also a common electrode. The touch electrode is electrically connected to the touch signal line 171 through a through-hole.

Then, proceed to step S716 to step S717.

The step S7 uses a same mask forming the patterned protective layer 18 and the patterned common electrode layer 19, which saves a mask process and simplifies the steps of the manufacturing method of the array substrate in the embodiment. Then, proceed to step S6.

The common electrode layer 19 is a transparent conductive layer. Optionally, a material of the transparent conductive layer is indium tin oxide.

Thus, the manufacturing method of the array substrate in the embodiment is completed.

Figure 5:
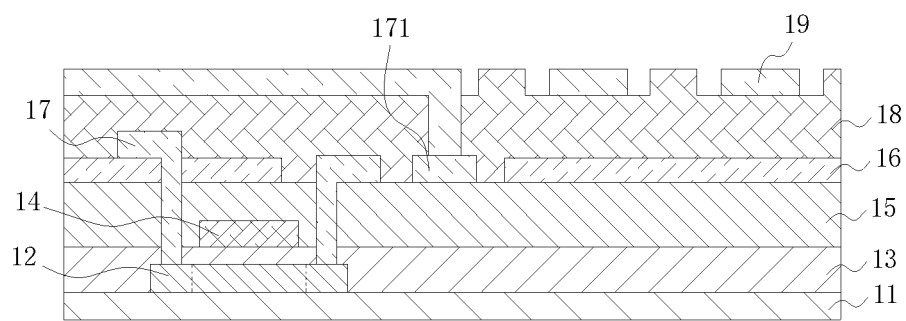
FIG. 5 is a schematic structural diagram of an array substrate according to an embodiment of the present disclosure.

Referring to FIG. 5, FIG. 5 is a schematic structural diagram of an array substrate according to an embodiment of the present disclosure. The present disclosure also relates to an array substrate which comprises a substrate 11 and an active layer 12, an insulation layer 13, a first metal layer 14, an interlayer dielectric layer 15, a pixel electrode layer 16, a second metal layer 17, a protective layer 18, and a common electrode layer 19 disposed on the substrate 11 in sequence.

Wherein, the first metal layer 14 comprises a gate electrode, the second metal layer 17 comprises a source electrode, a drain electrode, and a touch signal line 171, and the common electrode layer 19 comprises a common electrode and a touch electrode, wherein, the touch electrode and the common electrode share a same patterned common electrode layer. That is, a touch electrode is also a common electrode. The pixel electrode layer 16 comprises a pixel electrode. The touch electrode is electrically connected to the touch signal line 171 through a through-hole. The drain electrode is electrically connected to the pixel electrode.

In the array substrate of the embodiment, the touch signal line 171 and the pixel electrode layer 16 are disposed on a same layer. The drain electrode is stacked on the pixel electrode layer 16.

A part of the pixel electrode layer 16 corresponding to the drain electrode area of the active layer 12 is provided with a through-hole penetrating the pixel electrode layer 16 and the interlayer dielectric layer 15 and exposing the active layer 12. The drain electrode extends into the through-hole and is connected to the drain electrode area of the active layer 12.

Compared to current array substrates, the array substrate in the embodiment of the present disclosure saves a light-shielding layer for shielding the active layer and an organic planarization layer, thereby simplifying the processes and reducing cost.

The array substrate in the embodiment is prepared by the manufacturing method of the array substrate in the above embodiment.

Compared to current manufacturing methods of array substrates, the manufacturing method of the array substrate and the array substrate of the present disclosure use a same mask to form a patterned interlayer dielectric layer and a patterned pixel electrode layer, which not only saves a mask, but also omits an organic planarization layer. It solves the technical problem that current manufacturing methods of integrated touch array substrates are cumbersome and causes a higher production cost and a longer cycle.

In the above description, various changes and modifications can be made by those skilled in the art in accordance with the technical solutions and the technical concept of the present disclosure, and all such changes and modifications are subject to the protection scope of the appended claims.

What is claimed is:

1. A manufacturing method of an array substrate, comprising following steps:
   providing a substrate;
   forming a patterned active layer on the substrate;
   forming an insulation layer on the active layer;
   forming a patterned first metal layer on the insulation layer;
   forming a patterned interlayer dielectric layer and a patterned pixel electrode layer on the first metal layer by a same mask, wherein the patterned pixel electrode layer comprises a pixel electrode;
   forming a patterned second metal layer on the interlayer dielectric layer, wherein the patterned second metal layer comprises a drain electrode and a touch signal line, and the drain electrode is electrically connected to the pixel electrode; and
   forming a patterned protective layer and a patterned common electrode layer on the second metal layer by another same mask, wherein the patterned common electrode layer comprises a touch electrode, and the touch electrode is electrically connected to the touch signal line;
   wherein forming the patterned interlayer dielectric layer and the patterned pixel electrode layer on the first metal layer by the same mask comprises following steps:
   forming an interlayer dielectric layer, a pixel electrode layer, and a first photoresist layer on the first metal layer in sequence;
   using a first half-tone mask to expose the first photoresist layer, and then developing the first photoresist layer to make a part of the first photoresist layer corresponding to a source/drain electrode area of the active layer form a first through-hole, and make a part of the first photoresist layer corresponding to a part of the touch signal line to be formed in the second metal layer form a first recessed part, wherein the first through-hole of the first photoresist layer corresponding to a source electrode area of the active layer is connected to the first recessed part;
   etching the pixel electrode layer and the interlayer dielectric layer to expose the source/drain electrode area of the active layer to the first through-hole;
   ashing the first photoresist layer to remove a part of the first photoresist layer corresponding to the first recessed part;
   etching the pixel electrode layer to remove a part of the pixel electrode layer corresponding to the first recessed part; and
   removing the first photoresist layer.

2. The manufacturing method of the array substrate according to claim 1, wherein the first half-tone mask comprises a first light-transmission part and a second light-transmission part, a transmittance of the first light-transmission part is greater than a transmittance of the second light-transmission part, the transmittance of the first light-transmission part is 100%, the first light-transmission part corresponds to the source/drain electrode area of the active layer, and the second light-transmission part corresponds to the part of the touch signal line to be formed in the second metal layer.

3. The manufacturing method of the array substrate according to claim 1, wherein forming the patterned protective layer and the patterned common electrode layer on the second metal layer by the another same mask comprises following steps:
 forming a protective layer and a second photoresist layer on the second metal layer in sequence;
 using a second half-tone mask to expose the second photoresist layer and then developing the second photoresist layer to make a part of the second photoresist layer corresponding to the touch signal line form a second through-hole, and make a part of the second photoresist layer corresponding to a part of a common electrode and a touch electrode to be formed in a common electrode layer form a second recessed part, wherein the second through-hole of the second photoresist layer corresponding to the touch signal line is connected to the second recessed part;
 etching the protective layer to expose the touch signal line to the second through-hole;
 ashing the second photoresist layer to remove a part of the second photoresist layer corresponding to the second recessed part, and defining remaining second photoresist layer to form a plurality of third recessed parts exposing the protective layer;
 ashing the second photoresist layer and the protective layer to extend the third recessed parts to the protective layer;
 forming the common electrode layer on the second photoresist layer, wherein a part of the common electrode layer is formed on the second photoresist layer and another part of the common electrode layer is formed on the protective layer; and
 removing the second photoresist layer.

4. The manufacturing method of the array substrate according to claim 3, wherein the second half-tone mask comprises a third light-transmission part and a fourth light-transmission part, a transmittance of the third light-transmission part is greater than a transmittance of the fourth light-transmission part, the transmittance of the third light-transmission part is 100%, the third light-transmission part corresponds to the touch signal line, and the fourth light-transmission part corresponds to the part of the common electrode and the touch electrode to be formed in the common electrode layer.

5. The manufacturing method of the array substrate according to claim 1, wherein the patterned first metal layer is formed by a self-aligned doping process.

6. A manufacturing method of an array substrate, comprising following steps:
 providing a substrate;
 forming a patterned active layer on the substrate;
 forming an insulation layer on the active layer;
 forming a patterned first metal layer on the insulation layer;
 forming a patterned interlayer dielectric layer and a patterned pixel electrode layer on the first metal layer by a same mask, wherein the patterned pixel electrode layer comprises a pixel electrode; and
 forming a patterned second metal layer on the interlayer dielectric layer, wherein the patterned second metal layer comprises a drain electrode and a touch signal line, and the drain electrode is electrically connected to the pixel electrode;
 forming a patterned protective layer and a patterned common electrode layer on the second metal layer, wherein the patterned common electrode layer comprises a touch electrode, and the touch electrode is electrically connected to the touch signal line.

7. The manufacturing method of the array substrate according to claim 6, wherein forming the patterned interlayer dielectric layer and the patterned pixel electrode layer on the first metal layer by the same mask comprises following steps:
 forming an interlayer dielectric layer, a pixel electrode layer, and a first photoresist layer on the first metal layer in sequence;
 using a first half-tone mask to expose the first photoresist layer and then developing the first photoresist layer to make a part of the first photoresist layer corresponding to a source/drain electrode area of the active layer form a first through-hole, and make a part of the first photoresist layer corresponding to a part of the touch signal line to be formed in the second metal layer form a first recessed part, wherein the first through-hole of the first photoresist layer corresponding to a source electrode area of the active layer is connected to the first recessed part;
 etching the pixel electrode layer and the interlayer dielectric layer to expose the source/drain electrode area of the active layer to the first through-hole;
 ashing the first photoresist layer to remove a part of the first photoresist layer corresponding to the first recessed part;
 etching the pixel electrode layer to remove a part of the pixel electrode layer corresponding to the first recessed part; and
 removing the first photoresist layer.

8. The manufacturing method of the array substrate according to claim 7, wherein the first half-tone mask comprises a first light-transmission part and a second light-transmission part, a transmittance of the first light-transmission part is greater than a transmittance of the second light-transmission part, the transmittance of the first light-transmission part is 100%, the first light-transmission part corresponds to the source/drain electrode area of the active layer, and the second light-transmission part corresponds to the part of the touch signal line to be formed in the second metal layer.

9. The manufacturing method of the array substrate according to claim 6, wherein the patterned protective layer and the patterned common electrode layer are formed on the second metal layer by another same mask.

10. The manufacturing method of the array substrate according to claim 9, wherein forming the patterned protective layer and the patterned common electrode layer on the second metal layer by the another same mask comprises following steps:
 forming a protective layer and a second photoresist layer on the second metal layer in sequence;
 using a second half-tone mask to expose the second photoresist layer and then developing the second photoresist layer to make a part of the second photoresist layer corresponding to the touch signal line form a second through-hole, and make a part of the second photoresist layer corresponding to a part of a common electrode and a touch electrode to be formed in a common electrode layer form a second recessed part, wherein the second through-hole of the second photoresist layer corresponding to the touch signal line is connected to the second recessed part;

etching the protective layer to expose the touch signal line to the second through-hole;

ashing the second photoresist layer to remove a part of the second photoresist layer corresponding to the second recessed part, and defining the remaining second photoresist layer to form a plurality of third recessed parts exposing the protective layer;

ashing the second photoresist layer and the protective layer to extend the third recessed parts to the protective layer;

forming the common electrode layer on the second photoresist layer, wherein a part of the common electrode layer is formed on the second photoresist layer and another part of the common electrode layer is formed on the protective layer; and removing the second photoresist layer.

11. The manufacturing method of the array substrate according to claim 10, wherein the second half-tone mask comprises a third light-transmission part and a fourth light-transmission part, a transmittance of the third light-transmission part is greater than a transmittance of the fourth light-transmission part, the transmittance of the third light-transmission part is 100%, the third light-transmission part corresponds to the touch signal line, and the fourth light-transmission part corresponds to the part of the common electrode and the touch electrode to be formed in the common electrode layer.

12. The manufacturing method of the array substrate according to claim 6, wherein the patterned first metal layer is formed by a self-aligned doping process.

13. An array substrate, comprising a substrate and an active layer, an insulation layer, a first metal layer, an interlayer dielectric layer, a pixel electrode layer, a second metal layer, a protective layer, and a common electrode layer disposed on the substrate in sequence;

wherein the second metal layer comprises a drain electrode and a touch signal line, the pixel electrode layer comprises a pixel electrode, the common electrode layer comprises a touch electrode, the drain electrode is electrically connected to the pixel electrode, and the touch signal line is electrically connected to the touch electrode.

14. The array substrate according to claim 13, wherein the touch signal line and the pixel electrode layer are disposed on a same layer.

15. The array substrate according to claim 13, wherein the drain electrode is stacked on the pixel electrode layer.

* * * * *